(12) United States Patent
Michael et al.

(10) Patent No.: US 9,842,957 B1
(45) Date of Patent: Dec. 12, 2017

(54) ALGAAS/GAAS SOLAR CELL WITH BACK-SURFACE ALTERNATING CONTACTS (GAAS BAC SOLAR CELL)

(71) Applicant: The United States of America, as represented by the Secretary of the Navy, Washington, DC (US)

(72) Inventors: Sherif Michael, Pebble Beach, CA (US); Joseph E. O'Connor, Monterey, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 56 days.

(21) Appl. No.: 15/207,128

(22) Filed: Jul. 11, 2016

Related U.S. Application Data

(60) Provisional application No. 62/331,552, filed on May 4, 2016.

(51) Int. Cl.
*H01L 31/0224* (2006.01)
*H01L 31/0304* (2006.01)
(Continued)

(52) U.S. Cl.
CPC .. *H01L 31/0735* (2013.01); *H01L 31/022441* (2013.01); *H01L 31/0304* (2013.01);
(Continued)

(58) Field of Classification Search
CPC ......... H01L 31/022441; H01L 31/0304; H01L 31/03046; H01L 31/0682; H01L 31/0693; H01L 31/0735; Y02E 10/50; Y02E 10/544
See application file for complete search history.

(56) References Cited

U.S. PATENT DOCUMENTS

| 9,768,329 | B1 * | 9/2017 | Kayes | ................. | H01L 31/0232 |
| 2010/0132780 | A1 * | 6/2010 | Kizilyalli | ............ | H01L 31/0236 |
| | | | | | 136/255 |

(Continued)

OTHER PUBLICATIONS

Kerschaver et al., "Back-contact Solar Cells: A Review," Prog. Photovolt: Res. Appl. 14 (2006).

(Continued)

*Primary Examiner* — Lindsey A Bernier
(74) *Attorney, Agent, or Firm* — Naval Postgraduate School; James B. Potts (57) ABSTRACT

The disclosure provides a solar cell design featuring p-or-n type GaAs with alternating p-n junction regions on the back-surface of the cell, opposite incident solar irradiance. Various layers of p-or-n type GaAs are interfaced together to collect charge carriers, and a thin layer of AlGaAs is applied to the front and back surfaces to prevent recombination of charge carriers. In some embodiments, the layered an doped structure generally provides an AlGaAs window layer of about 20 nm doped to about $4\times(10^{18})$ cm$^{-3}$, a GaAs absorption layer of about 2000 nm doped to about $4\times(10^{17})$ cm$^{-3}$, a GaAs emitter layer of about 150 nm and doped to $1\times(10^{18})$ cm$^{-3}$, an AlGaAs heterojunction layer of about 40 nm doped to about $3\times(10^{18})$ cm$^{-3}$, and a GaAs emitter-contact layer of about 20 nm doped to about $1\times(10^{19})$ cm$^{-3}$. Additionally, AlGaAs BSF layer and GaAs BSF-contact layers each have a depth of about 20 nm and are doped to about $4\times(10^{18})$ cm$^{-3}$ and $1\times(10^{19})$ cm$^{-3}$ respectively. The emitter layer, heterojunction layer, and emitter-contact layer are doped to a conductivity type opposite the absorption layer.

16 Claims, 3 Drawing Sheets

(51) Int. Cl.
H01L 31/068 (2012.01)
H01L 31/0693 (2012.01)
H01L 31/0735 (2012.01)
(52) U.S. Cl.
CPC .... H01L 31/03046 (2013.01); H01L 31/0682 (2013.01); H01L 31/0693 (2013.01); *Y02E 10/50* (2013.01); *Y02E 10/544* (2013.01)

(56) References Cited

U.S. PATENT DOCUMENTS

2012/0103406 A1* 5/2012 Kayes ............. H01L 31/022425
    136/256
2012/0104460 A1* 5/2012 Nie .................... H01L 31/0735
    257/184

OTHER PUBLICATIONS

Belghachi et al., "Effect of the front surface field on GaAs solar cell photocurrent," Solar Energy Materials & Solar Cells 92 (2008).
Ho et al., "Optimization of All-Back-Contact GaAs Solar Cells," 2015 International Conference on Numerical Simulation of Optoelectronic Devices (NUSOD) (2015).
Kerns et al., "The design of radiation-hardened ICs for space: a compendium of approaches," Proceedings of the IEEE 76(11) (1988).
Miller et al., "Strong internal and external luminescence as solar cells approach the Shockley-Queisser limit," IEEE Journal on Photovoltaics 2(3) (2012).
Silverman et al., "Outdoor performance of a thin-film gallium-arsenide photovoltaic module," Proc. IEEE Photovoltaic Specialist Conference (2013).
Singh et al., "Temperature dependence of solar cell performance—an analysis," Solar Energy Materials & Solar Cells (2012).
Wang et al., "Design of GaAs cells operating close to the Shockley-Queisser limit," IEEE Journal of Photovoltaics, 3 (2) (2013).
Wang et al., "Approaching the Schockley-Queisser limit in GaAs solar cells," IEEE Photovoltaic Specialist Conference (2012).
"Single Junction Solar Cells—Photovoltaics Lab IOFFE," available at http://pvlab.ioffe.ru/about/solar_cells.html, last accessed Jul. 12, 1016.
Kayes et al., "27.6% conversion efficiency, a new record for single junction solar cells under 1 sun illumination," in IEEE Photovoltaic Specialist Conference (2011).
Mattos et al., "New module efficiency record: 23.5% under 1-sun illumination using thin-film single-junction GaAs solar cells," IEEE Photovolatic Specialist Conference (2012).
Zhang, "High efficiency GaAs-based solar cells simulation and fabrications," Master's Thesis, Arizona State University, Tempe, AZ. (2014).
Bauhuis et al., "26.1% thin-film GaAs cell using epitaxial lift-off," Solar Energy Materials & Solar Cells 93(9) (2009).
Cruz-Campa et al., "Back-contacted and small form factor GaAs solar cell," IEEE Photovoltaic Specialist Conference (2010).
Granek, "High-efficiency back-contact back-junction silicon solar cells," Ph.D. dissertation, Faculty of Engineering, University of Freiburg, Germany (2009).
Zhou et al., "Design of GaAs solar cell front surface anti-reflection coating," IEEE Vehicular Electronics and Safety Conference (2013).
Saylan et al., "Multilayer antireflection coating design for GaAsP/Si dual-junction solar cells," Solar Energy 122 (2015).
Perl et al., "Ultrabroadband and wid-angle hybrid antireflection coatings with nanostructurs," IEEE Journal of Photovoltaics 4(3) (2014).
Baca et al., "A survey of ohmic contacts to III-V compound semiconductors," Thin Solid Films, vol. 308-309 (1997).
Schroder et al., "Solar cell contact resistance—a review," IEEE Transactions on Electron Devices 31(5) (1984).
Padilla et al., "Characterizing local contact resistance of interdigitated back contact silicon solar cells," European PV Solar Energy Conference and Exhibition (2014).
Macherzynski et al., "Fabrication of ohmic contact based on platinum to p-type compositionally graded AlGaAs layers," Journal of Physics: Conference Series 146 (2009).

* cited by examiner

ALGAAS/GAAS SOLAR CELL WITH BACK-SURFACE ALTERNATING CONTACTS (GAAS BAC SOLAR CELL)

RELATION TO OTHER APPLICATIONS

This patent application claims priority from provisional patent application 62/331,552 filed May 4, 2016, which is hereby incorporated by reference in its entirety.

FIELD OF THE INVENTION

One or more embodiments relates to a solar cell design featuring p-or-n type GaAs and AlGaAs with alternating p-n junction regions on the back-surface of the cell.

BACKGROUND

Solar cells produce electric current and voltage in order to power an external load, and a primary goal of solar cell design is to increase power output while balancing manufacturing cost. Due to the widespread availability and low cost of silicon versus other semiconductor materials, it has remained the overwhelming choice for solar cell manufacturers. However, since silicon is an "indirect band gap" semiconductor, energy (heat) must be exchanged with the crystal lattice in the form of phonons in order to free electrons. Silicon only uses a portion of the solar spectrum to free electrons. Much of the remaining spectrum energy is absorbed by the crystal lattice, which causes the temperature of the solar cell to rise during normal operation. Additionally, the low surface-state density characteristic of silicon makes it susceptible to radiation damage over time, especially in outer-space applications. High energy particles from the sun create intermediate energy states in a solar cell which lead to higher recombination rates and lower efficiency.

Surface-state density of Gallium Arsenide (GaAs) is much larger than silicon, and the material is inherently harder to total-dose radiation. See Kerns et al., "The design of radiation-hardened ICs for space: a compendium of approaches," *Proceedings of the IEEE* 76(11) (1988). GaAs is a "direct band gap" semiconductor that absorbs photon energy and free electrons without transferring momentum, and less heat is absorbed in the crystal lattice. This generates significant improvements for solar cell design such as lower operating temperatures in a given environment. See Silverman et al., "Outdoor performance of a thin-film gallium-arsenide photovoltaic module," *Proc. IEEE Photovoltaic Specialist Conference* (2013). GaAs provideds additional advantages over silicon including thinner absorbing layers, which improves flexibility and reduces weight. Additionally, GaAs cells maintain performance advantages as irradiance decreases. Generally, high-efficiency GaAs cells produce about 20% more power than high-efficiency silicon cells at room temperature, and about 28% more power at typical operating temperatures. See Reich et al., "Weak light performance and spectral response of different solar cell types," *Proc. 20th European Photovoltaic Solar Energy Conference* (2005).

Further advantages in solar cell operation may accrue through the placement of all electrical contacts on the back-surface of the solar cell. The key advantage of the design is the corresponding placement of the emitter and its associated electrical contacts on the back-surface of the solar cell. This improves both the optical and electrical performance of the solar cell since shading is eliminated and robust electrical contacts may be used to decrease serial resistance. To date, back-surface contact solar cell designs have focused almost exclusively on silicon as the semiconductor of choice.

It would be advantageous to provide a GaAs-based solar cell having relatively optimized layer structure and doping concentrations for back-surface contact operation. Such a solar cell would provide significant advantage over silicon-based cells while additionally providing the advantages associated with back-surface contact placement.

These and other objects, aspects, and advantages of the present disclosure will become better understood with reference to the accompanying description and claims.

SUMMARY

The disclosure provides a Back-surface, Alternating Contacts (BAC) Solar Cell featuring p-or-n type GaAs with alternating p-n junction regions on the back-surface of the cell. Various layers of p-or-n type GaAs are interfaced together to collect charge carriers, and a thin layer of AlGaAs is applied to the front and back surfaces to minimize recombination of charge carriers. Highly reflective, back-surface, metal contacts are used to recycle photons and improve optical and electrical performance.

The novel BAC solar cell provides a layered structure including a window layer comprising aluminum gallium arsenide (AlGaAs) and an absorption layer comprising GaAs, with the window and absorption layers doped to a first conductivity type such as p or n. An emitter layer comprising GaAs is adjacent the absorption layer, followed by a heterojunction layer comprising AlGaAs and an emitter-contact layer comprising GaAs. The emitter layer, heterojunction layer, and emitter-contact layer are doped to a conductivity type opposite the absorption layer. A contact couples to the emitter-contact layer. The BAC solar cell additionally includes a BSF layer comprising AlGaAs and adjacent to the absorption layer, followed by a BSF-contact layer comprising GaAs. The BSF layer and BSF-contact layer are doped to the first conductivity type of the absorption layer, and another contact is coupled to BSF-contact layer. The BAC solar cell further comprises a gap with or without a proprietary insulator (insulator gap) separating the emitter layer, heterojunction layer, and emitter-contact layer from the BSF and BSF-contact layers.

In particular embodiments, the disclosed layers have complementing depths and doping concentrations in order to provide advantageous operation of the BAC Solar Cell. In some embodiments, the window layer has a depth of about 20 nanometers (nm), the absorption layer has a depth of about 2000 nm, the emitter layer has a depth of about 150 nm, the heterojunction layer has a depth of about 40 nm, and the emitter-contact layer has a depth of about 20 nm. Additionally, the BSF and BSF-contact layers each have a depth of about 20 nm. In other embodiments the window layer has a doping concentration of about $4\times(10^{18})$ cm$^{-3}$, the absorption layer has a doping concentration of about $4\times(10^{17})$ cm$^{-3}$, the emitter layer has a doping concentration of about $1\times(10^{18})$ cm$^{-3}$, the heterojunction layer has a doping concentration of about $3\times(10^{18})$ cm$^{-3}$, and the emitter-contact layer has a doping concentration of about $1\times(10^{19})$ cm$^{-3}$, while the BSF layer has a doping concentration of about $4\times(10^{18})$ cm$^{-3}$ and the BSF-contact layer has a doping concentration of about $1\times(10^{19})$ cm$^{-3}$.

The novel apparatus and principles of operation are further discussed in the following description.

Embodiments in accordance with the invention are further described herein with reference to the drawings.

DETAILED DESCRIPTION OF THE INVENTION

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide a solar cell design featuring p-or-n type GaAs with alternating p-n junction regions on the back-surface of the cell.

The disclosure provides a novel solar cell design featuring p-or-n type GaAs with alternating p-n junction regions on the back-surface of the cell, opposite incident solar irradiance. Various layers of p-or-n type GaAs are interfaced together to collect charge carriers, and a thin layer of AlGaAs is applied to the front and back surfaces to prevent recombination of charge carriers. Layer properties (thickness, material, doping, etc.) are generally optimized to improve overall conversion efficiency. Highly reflective, back-surface, metal contacts are used to recycle photons and improve optical and electrical performance. Other advantages include better long-term performance in high-radiation environments; higher conversion efficiency at elevated temperatures; and a lighter, more flexible structure for mobile applications.

Figure 1:
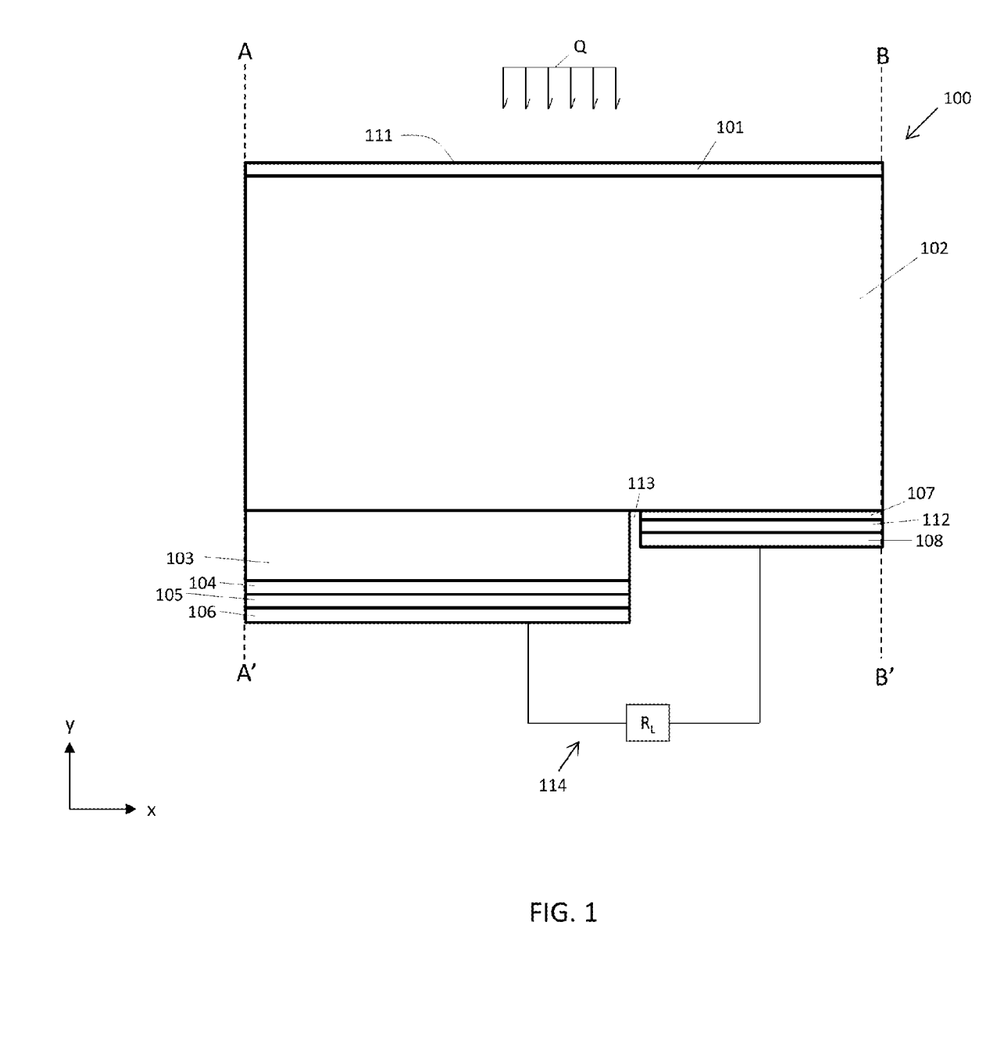
FIG. 1 illustrates an embodiment of the BAC Solar Cell.

FIG. 1 illustrates BAC Solar Cell generally at 100 and generally intended to receive a solar irradiance Q. BAC Solar Cell 100 comprises a plurality of stacked layers including window layer 101, absorption layer 102, BSF layer 107, BSF-contact layer 112, and first contact 108, as well as emitter layer 103, heterojunction layer 104, emitter-contact layer 105, and second contact 106. FIG. 1 generally provides a section of BAC Solar Cell 100 illustrated between axes A-A' and B-B' which is generally repeated across the BAC Solar Cell disclosed. In certain embodiments, BAC solar cell 100 further comprises anti-reflective coating 111. Note that 101 has a smooth surface; however, texturing 101 may further minimize reflection thus increasing the transmission of photons. Typically for BAC Solar Cell 100, window layer 101, absorption layer 102, BSF layer 107 and BSF-contact layer 112 are doped to a first conductivity type such as p-type, and emitter layer 103, heterojunction layer 104, and emitter-contact layer 105 are doped to a second conductivity type such as n-type. Alternatively, window layer 101, absorption layer 102, BSF layer 107, and BSF-contact layer 112 may be doped to n-type, while emitter layer 103, heterojunction layer 104, and emitter-contact layer 105 may be doped to p-type. Both arrangements are contemplated within this disclosure. Here and elsewhere, "conductivity type" refers to a property that identifies the majority charge carrier in a semiconductor material, where the majority current carriers in n-type material are electrons and the majority current carriers in p-type material are holes. See e.g. K. Rajeshwar, *Fundamentals of Semiconductor Electrochemistry and Photochemistry* (2007), among others.

At FIG. 1, window layer 101 comprises aluminum gallium arsenide (AlGaAs). Absorption layer 102 is adjacent to and generally in contact with window layer 101 and comprises gallium arsenide (GaAs). BSF layer 107 is adjacent to and generally in contact with absorption layer 102 and comprises AlGaAs. BSF-contact layer 112 is adjacent to and generally in contact with BSF layer 107 and comprises GaAs. First contact 108 is coupled to BSF-contact layer 112 and comprises a metal. In a particular embodiment, first contact 108 comprises a layered combination of gold, platinum, and titanium. Further at FIG. 1, emitter layer 103 is adjacent to and generally in contact with absorption layer 102 and comprises GaAs. Heterojunction layer 104 is adjacent to and generally in contact with emitter layer 102 and comprises AlGaAs. Emitter-contact layer 105 is adjacent to and generally in contact with heterojunction layer 104 and comprises GaAs. Second contact 106 is coupled to emitter-contact layer 105 and comprises a metal. In a particular embodiment, second contact 106 comprises a layered combination of gold, platinum, and titanium.+. Solar cell 100 further comprises an insulator gap 113 generally comprising an insulating material and separating emitter layer 103, heterojunction layer 104, emitter-contact layer 105, and second contact 106 from BSF layer 107, BSF-contact layer 112, and first contact 108. First contact 108 and second contact 106 are typically present in BAC Solar Cell 100 as interdigitated contacts.

The window layer 101, absorption layer 102, BSF layer 107, BSF-contact layer 112, emitter layer 103, heterojunction layer 104, and emitter-contact layer 105 have generally preferred depths within the BAC Solar Cell 100, where here "depth" indicates dimensions in a direction parallel to the y-axis shown. In a particular embodiment, window layer 101 has a depth greater than 20 nm and less than 40 nm, absorption layer 102 has a depth greater than 1000 nm and less than 3000 nm, BSF layer 107 has a depth greater than 20 nm and less than 40 nm, BSF-contact layer 112 has a depth greater than 20 nm and less than 40 nm, emitter layer 103 has a depth greater than 120 nm and less than 180 nm, heterojunction layer 104 has a depth greater than 30 nm and less than 50 nm, and emitter-contact layer 105 has a depth greater than 20 nm and less than 40 nm. Further in a particular embodiment, emitter layer 103 is in contact with absorber layer 102 over an width $w_1$ and BSF layer 107 is in contact with absorber layer 102 over a width $w_2$, and $1.35 < w_1/w_2 < 1.65$, $1.4 < w_1/w_2 < 1.6$, $1.45 < w_1/w_2 < 1.55$, or $1.48 < w_1/w_2 < 1.52$, where $w_1$ and $w_2$ are dimensions in a direction parallel to the x-axis shown. Generally the $w_1/w_2$ is about 1.5 to maximize the number of minority carriers captured by the emitter. In a particular embodiment, insulator gap 113 has a width $w_G$, and a $w_{Total}$ is equal $w_1 + w_2 + w_G$, and $(w_1 + w_2)/w_{Total} > 0.8$, 0.9, 0.95, or 0.98. Generally, $w_1/w_2$ is optimized to a ratio around 60/40 to maximize the number of minority carriers captured by emitter layer 103.

Additionally in a particular embodiment, window layer 101 has a doping concentration $N_1$, absorption layer 102 has a doping concentration $N_2$, BSF layer 107 has a doping concentration $N_3$, and BSF-contact layer 112 has a doping concentration $N_4$, and $N_1 > N_2$, $N_3 > N_2$, and $N_4 > N_3$. In a particular embodiment, $3 \times 10^{18}$ cm$^{-3}$ < $N_1$ < $5 \times 10^{18}$ cm$^{-3}$, $3 \times 10^{17}$ cm$^{-3}$ < $N_2$ < $5 \times 10^{17}$ cm$^{-3}$, $3 \times 10^{18}$ cm$^{-3}$ < $N_3$ < $5 \times 10^{18}$ cm$^{-3}$, and $8 \times 10^{18}$ cm$^{-3}$ < $N_4$ < $1.2 \times 10^{19}$ cm$^{-3}$. In another embodiment, emitter layer 103 has a doping concentration $N_5$, heterojunction layer 104 has a doping concentration $N_6$, and emitter-contact layer 105 has a doping concentration $N_7$, and $N_5 < N_6$ and $N_6 < N_7$. In a particular embodiment, $8 \times 10^{17}$ cm$^{-3}$ < $N_5$ < $1.2 \times 10^{18}$ cm$^{-3}$, $2 \times 10^{18}$ cm$^{-3}$ < $N_6$ < $4 \times 10^{18}$ cm$^{-3}$, and $8 \times 10^{18}$ cm$^{-3}$ < $N_7$ < $1.2 \times 10^{19}$ cm$^{-3}$. In certain embodiments, $N_2 < N_5$. Here and elsewhere "doping concentration" means the number of ions per cubic centimeter of the material, and is generally facilitated through foreign atoms incorporated into the crystal structure of the semiconductor. Various doping concentrations may be achieved through means known in the art. See e.g. M. McCluskey and E. Haller, *Dopants and Defects in Semiconductors* (2012), among others. In a particular embodiment, n-type GaAs or AlGaAs materials comprise a dopant of silicon, tin, selenium, tellurium, or sulfur. In another embodiment, p-type GaAs or AlGaAs materials comprise a dopant of zinc, beryllium, cadmium, magnesium, or carbon.

In certain embodiments, window layer 101 comprises $Al_xGa_{(1-x)}As$, heterojunction layer 104 comprises $Al_yGa_{(1-y)}As$, and BSF layer 107 comprises $Al_zGa_{(1-z)}As$. When absorption layer 102 comprises n-type material and emitter layer 103 comprises p-type material such that BAC Solar Cell 100 is an n-on-p solar cell, and correspondingly window layer 101 and BSF layer 107 comprise n-type material while heterojunction layer 104 comprises p-type material, then x is typically about 0.3, y is typically about 0.85, and z is typically about 0.3. When absorption layer 102 comprises p-type material and emitter layer 103 comprises n-type material such that BAC Solar Cell 100 is an p-on-n solar cell, and correspondingly window layer 101 and BSF layer 107 comprise p-type material while heterojunction layer 104 comprises n-type material, then x is typically about 0.7, y is typically about 0.15, and z is typically about 0.7. In certain embodiments, when BAC Solar Cell 100 is an n-on-p solar cell, then $0.2<x<0.4$, preferably $0.25<x<0.35$, and more preferably $0.28<x<0.32$, and $0.75<y<0.95$, preferably $0.8<y<0.9$, and more preferably $0.83<y<0.87$, and $0.2<z<0.4$, preferably $0.25<z<0.35$, and more preferably $0.28<z<0.32$. In another embodiment when BAC Solar Cell 100 is a p-on-n solar cell, then $0.6<x<0.8$, preferably $0.65<x<0.75$, and more preferably $0.68<x<0.72$, and $0.05<y<0.25$, preferably $0.1<y<0.2$, and more preferably $0.13<y<0.17$, and $0.6<z<0.8$, preferably $0.65<z<0.75$, and more preferably $0.68<z<0.72$.

In a particular embodiment, window layer 101 is at least 70 weight percent (wt. %), preferably at least 80 wt. %, and more preferably at least 90 wt. % AlGaAs. In another embodiment, absorption layer 102 is at least 70 wt. %, preferably at least 80 wt. %, and more preferably at least 90 wt. % GaAs. In another embodiment, emitter layer 103 is at least 70 wt. %, preferably at least 80 wt. %, and more preferably at least 90 wt. % GaAs. In another embodiment, heterojunction layer 104 is at least 70 wt. %, preferably at least 80 wt. %, and more preferably at least 90 wt. % AlGaAs. In another embodiment, emitter-contact layer 105 is at least 70 wt. %, preferably at least 80 wt. %, and more preferably at least 90 wt. % GaAs. In another embodiment, BSF layer 107 is at least 70 wt. %, preferably at least 80 wt. %, and more preferably at least 90 wt. % AlGaAs, and in a further embodiment, BSF-contact layer 112 is at least 70 wt. %, preferably at least 80 wt. %, and more preferably at least 90 wt. % GaAs. The various layers as disclosed in BAC Solar Cell 100 may be fabricated using any suitable means including bulk methods such as Czochralski and Bridgman methods, or epitaxial growth methods such as liquid phase epitaxy (LPE), chemical vapor deposition (CVD), molecular organic chemical vapor deposition (MOCVD) or molecular beam epitaxy (MBE), or any other suitable means known in the art.

In some embodiments, anti-reflective coating 111 comprises a wide-spectrum, four layer antireflective coating of $MgF_2/TiO_2/MgF_2/TiO_2$ with respective depths of generally about 100 nm/10 nm/20 nm/40 nm. Other arrangements known in the art for use as anti-reflective coatings may also be utilized. See e.g., Thosar et al., "Optimization of Antireflection Coating for Improving the Performance of GaAs Solar Cell," *Indian Journal of Science and Technology*, 7(5) (2014); see also Zhou et al, "Design of GaAs solar cell front surface anti-reflection coating," *Vehicular Electronics and Safety (ICVES)*, 2013 IEEE International Conference on (2013), among others.

Generally, when BAC Solar Cell 100 is an n-on-p solar cell such that window layer 101, absorption layer 102, BSF layer 107 and BSF-contact layer 112 are n-type materials while emitter layer 103, heterojunction layer 104, and emitter-contact layer 105 are p-type materials, when an incident photon with sufficient energy refracts through window layer 101 into absorption layer 102, its energy may be transferred to an electron, effectively "freeing" the electron from its atomic (covalent) bond and leaving a "hole" behind in the crystal lattice—the electron and hole are often called an "electron-hole pair." The hole is termed the "minority carrier" because it exists within a n-type material that has many more electrons than holes. The hole may move about (diffuse) freely within the crystal lattice. If the hole diffuses to the vicinity of the electric field formed between window layer 101 and absorption layer 102, it is repelled away from the surface to prevent recombination. If the electron diffuses to the vicinity of the electric field formed between absorption layer 102 and emitter layer 103, it is captured by the electric field and swept into an external circuit as electric current. After completing its transit through the external circuit, the hole recombines with an electron in the crystal lattice, thus completing the cycle. For example, at FIG. 1, BAC Solar Cell might generate current through the external circuit generally indicated at 114 and comprising load $R_L$ between second contact 106 and first contact 108.

Figure 2:
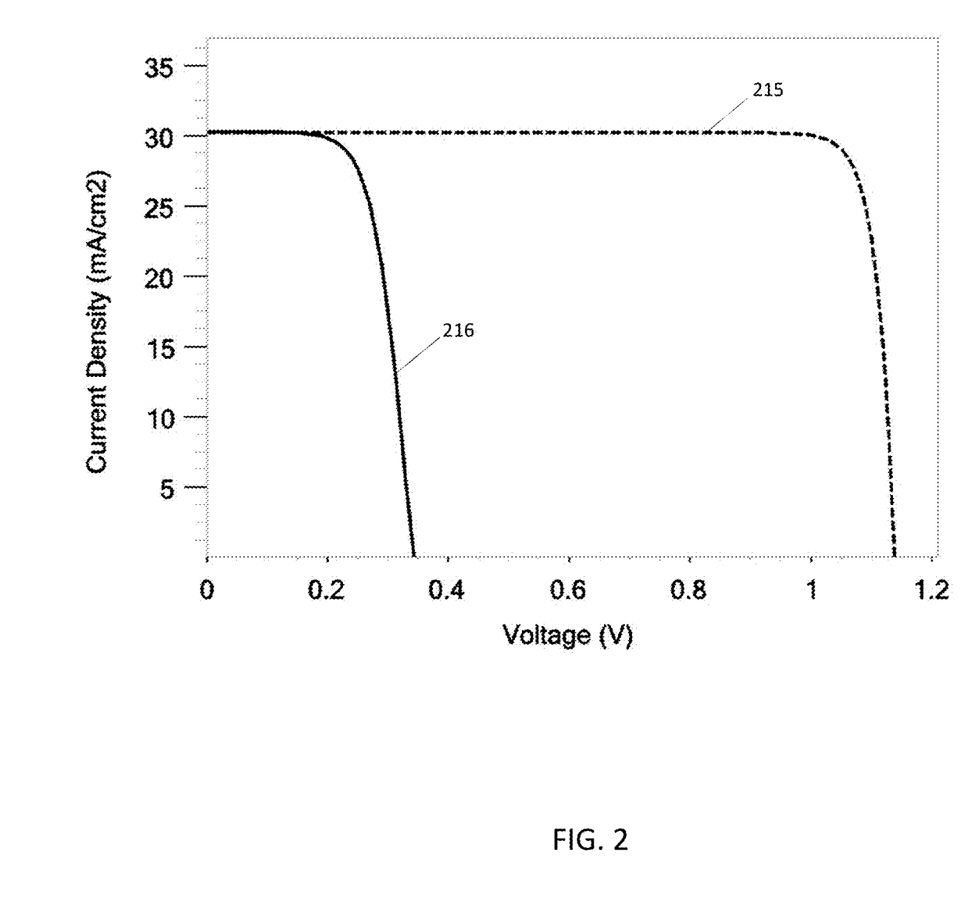
FIG. 2 illustrates current density and voltage for an embodiment of the BAC Solar Cell.
Figure 3:
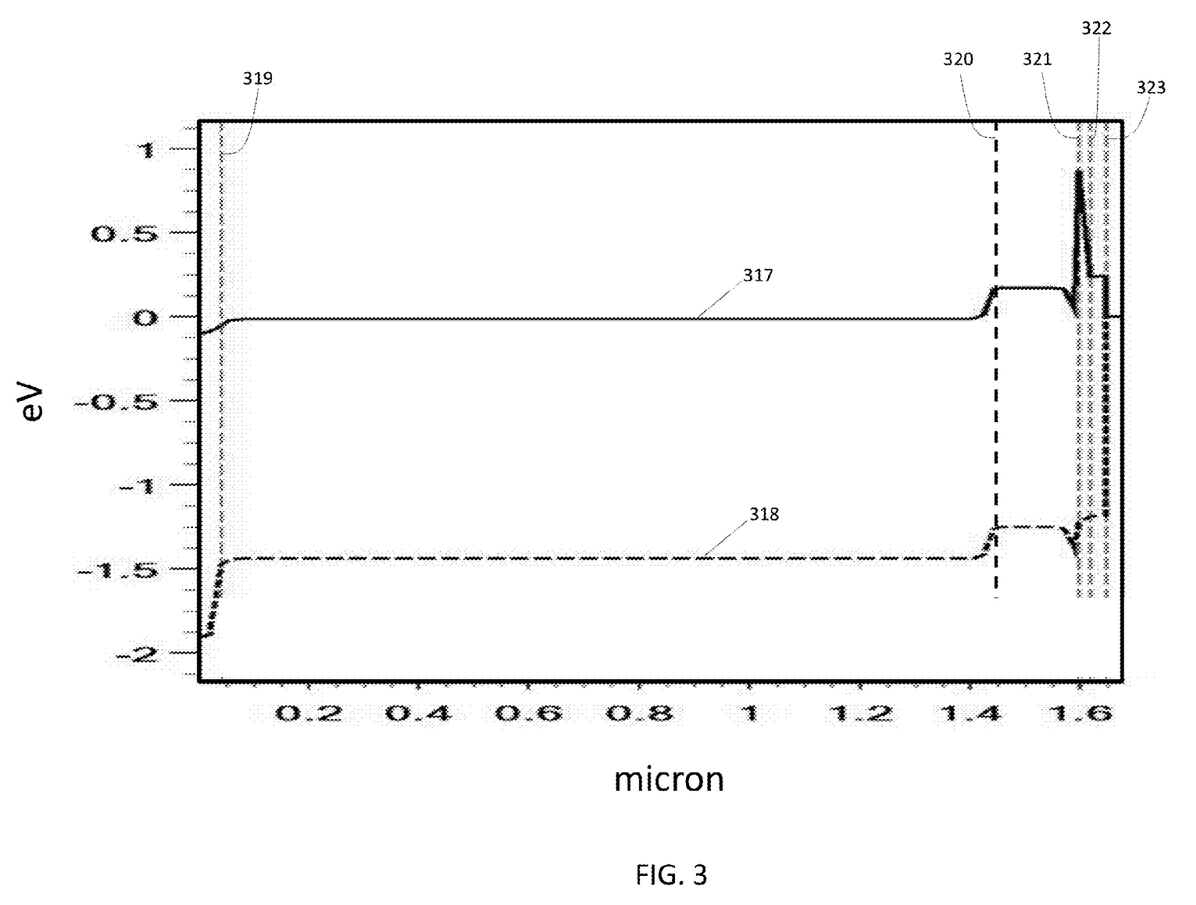
FIG. 3 illustrates Conduction Band (CB) and Valence Band (VB) level through another embodiment of the BAC Solar Cell.

The performance of BAC Solar Cell 100 is significantly improved by the inclusion of emitter-contact layer 105 comprising GaAs. The arrangement of emitter layer 103, heterojunction layer 104, and emitter-contact layer 105 as described facilitates a conduction band (CB) and valance band (VB) arrangement at layer interfaces which leads to dramatic improvements in BAC Solar Cell performance. As an example, FIG. 2 illustrates current density versus voltage for BAC Solar Cell 100 when emitter-contact layer 105 is present as trace 215, and illustrates current density versus voltage for BAC Solar Cell 100 when emitter-contact layer 105 is absent as trace 216. The respective traces result from a novel application of a simulation package for semiconductor devices known as ATLAS applied to an embodiment of the BAC Solar Cell disclosed. See U.S. Patent Application 62/331,552 filed by Michael et al., filed May 4, 2016, which is incorporated herein by reference. Without the presence of emitter-contact layer 105 as described, BAC Solar Cell 100 voltage decreases by about 70% and the efficiency of BAC Solar Cell 100 decreases by about 77%. CB and VB eV levels for a particular embodiment of BAC Solar Cell 100 are illustrated at FIG. 3 versus layer depth for BAC Solar Cell 100, where CB is indicated as 317 and VB is indicated as 318, with the interface between window layer 101 and absorption layer 102 indicated as 319, the interface between absorption layer 102 and emitter layer 103 indicated as 320, the interface between emitter layer 103 and heterojunction 104 indicated as 321, the interface between heterojunction layer 104 and emitter-contact layer 105 indicated as 322, and the interface between emitter-contact layer 105 and second contact 106 as 323.

The design represented at FIG. 1 creates conditions that maximize the number of minority carriers that contribute to electric current. Since absorption layer 102 generally has a depth of only about 1000-3000 nm, minority carriers have a much higher probability of reaching the electrical contacts and contributing to load current.

Further, the highly-reflective, back-surface, metal contacts 106 and 108 used in this embodiment improve solar cell efficiency. If photons fail to produce an electron-hole pair in absorption layer 102 during transit, they are reflected off the back-surface contacts and transit back into absorption layer 102, affording another opportunity to create an electron-hole pair. Photons spontaneously emitted during optical recombination may also reflect off the back-surface contacts and transit back into absorption layer 102. This cycle may continue many times and is often termed "photon recycling." Additionally, window layer 101 and anti-reflective coating 111 are designed to minimize the "escape cone" out of the front of the solar cell, effectively "trapping" photons and increasing the probability that they will create an electron-hole pair.

The design represented at FIG. 1 additionally utilizes a strong selective front surface field generated by virtue of the AlGaAs-comprising window layer 101 and the GaAs-comprising absorption layer 102. The respective doping levels generate a front surface field which significantly decreases front surface recombination velocity by forming an electric field and introducing a barrier to minority carriers flowing to the front surface. Hence the carrier recombination is reduced at the front surface and the probability of carrier-collection at second contact 106 increases. The thin nature of absorption layer 102 allows the minority carriers created to travel to emitter layer 103 with a minimum of recombination.

Thus, presented here is a novel solar cell design featuring p-or-n type GaAs with alternating p-n junction regions on the back-surface of the cell, opposite incident solar irradiance. Various layers of p-or-n type GaAs are interfaced together to collect charge carriers, and a thin layer of AlGaAs is applied to the front and back surfaces to prevent recombination of charge carriers. Layer properties (thickness, material, doping, etc.) are generally optimized to improve overall conversion efficiency to more than 30%. Highly reflective, back-surface, metal contacts are used to recycle photons and improve optical and electrical performance. Other advantages include better long-term performance in high-radiation environments; higher conversion efficiency at elevated temperatures; and a lighter, more flexible structure for mobile applications.

It is to be understood that the above-described arrangements are only illustrative of the application of the principles of the present invention and it is not intended to be exhaustive or limit the invention to the precise form disclosed. Numerous modifications and alternative arrangements may be devised by those skilled in the art in light of the above teachings without departing from the spirit and scope of the present invention. It is intended that the scope of the invention be defined by the claims appended hereto.

In addition, the previously described versions of the present invention have many advantages, including but not limited to those described above. However, the invention does not require that all advantages and aspects be incorporated into every embodiment of the present invention.

All publications and patent documents cited in this application are incorporated by reference in their entirety for all purposes to the same extent as if each individual publication or patent document were so individually denoted.

What is claimed is:

1. A Back-surface, Alternating Contact (BAC) solar cell comprising:
a window layer comprising AlGaAs doped to a first conductivity type;
an absorption layer contacting the window layer where the absorption layer comprises GaAs doped to the first conductivity type;
a BSF layer contacting the absorption layer and separated from the window layer by the absorption layer, where the BSF layer comprises AlGaAs doped to the first conductivity type;
a BSF-contact layer contacting the BSF layer and separated from the absorption layer by the BSF layer, where the BSF-contact layer comprises GaAs doped to the first conductivity type;
a first contact coupled to the BSF-contact layer and separated from the BSF layer by the BSF-contact layer;
an emitter layer contacting the absorption layer and separated from the window layer by the absorption layer, and the emitter layer displaced from the BSF layer, the BSF-contact layer, and the first contact, where the emitter layer comprises GaAs doped to a second conductivity type;
a heterojunction layer contacting the emitter layer and separated from the absorption layer by the emitter layer, and the heterojunction layer displaced from the BSF layer, the BSF-contact layer, and the first contact, where the heterojunction layer comprises AlGaAs doped to the second conductivity type;
a emitter-contact layer contacting the heterojunction layer and separated from the emitter layer by the heterojunction layer, and the emitter-contact layer displaced from the BSF layer, the BSF-contact layer, and the first contact, where the emitter-contact layer comprises GaAs doped to the second conductivity type; and
a second contact coupled to the emitter-contact layer and separated from the heterojunction layer by the emitter-contact layer.

2. The BAC solar cell of claim 1 where:
a doping concentration of the GaAs comprising the absorption layer is less than a doping concentration of the AlGaAs comprising the window layer;
a doping concentration of the AlGaAs comprising the heterojunction layer is greater than a doping concentration of the GaAs comprising the emitter layer; and
a doping concentration of the GaAs comprising the emitter-contact layer is greater than the doping concentration of the AlGaAs comprising the heterojunction layer.

3. The BAC solar cell of claim 2 where the doping concentration of the GaAs comprising the emitter layer is greater than the doping concentration of the GaAs comprising the absorption layer.

4. The BAC solar cell of claim 3 where:
a doping concentration of the AlGaAs comprising the BSF layer is greater than the doping concentration of the GaAs comprising the absorption layer; and
a doping concentration of the GaAs comprising the BSF-contact layer is greater than the doping concentration of the AlGaAs comprising the BSF layer.

5. The BAC solar cell of claim 4 where:
the doping concentration of the AlGaAs comprising the window layer is greater than $3\times(10^{18})$ cm$^{-3}$ and less than $5\times(10^{18})$ cm$^{-3}$;
the doping concentration of the GaAs comprising the absorption layer is greater than $3\times(10^{17})$ cm$^{-3}$ and less than $5\times(10^{17})$ cm$^{-3}$;
the doping concentration of the AlGaAs comprising the BSF layer is greater than $3\times(10^{18})$ cm$^{-3}$ and less than $5\times(10^{18})$ cm$^{-3}$;

the doping concentration of the GaAs comprising the BSF-contact layer is greater than $8\times(10^{18})$ cm$^{-3}$ and less than $1.2\times(10^{19})$ cm$^{-3}$;

the doping concentration of the GaAs comprising the emitter layer is greater than $8\times(10^{17})$ cm$^{-3}$ and less than $1.2\times(10^{18})$ cm$^{-3}$;

the doping concentration of the AlGaAs comprising the heterojunction layer is greater than $2\times(10^{18})$ cm$^{-3}$ and less than $4\times(10^{18})$ cm$^{-3}$; and the doping concentration of the GaAs comprising the emitter-contact layer is greater than $8\times(10^{18})$ cm$^{-3}$ and less than $1.2\times(10^{19})$ cm$^{-3}$.

6. The BAC solar cell of claim 4 where the window layer is at least 80 wt. % AlGaAs, the absorption layer is at least 80 wt. % GaAs, the emitter layer is at least 80 wt. % GaAs, the heterojunction layer is at least 80 wt. % AlGaAs, the emitter-contact layer is at least 80 wt. % GaAs, the BSF layer is at least 80 wt. % AlGaAs, and the BSF-contact layer is at least 80 wt. % GaAs.

7. The BAC solar cell of claim 1 where:
a depth of the window layer is greater than 20 nm and less than 40 nm;
a depth of the absorption layer is greater than 1000 nm and less than 3000 nm;
a depth of the BSF layer is greater than 20 nm and less than 40 nm;
a depth of the BSF-contact layer is greater than 20 nm and less than 40 nm;
a depth of the emitter layer is greater than 120 nm and less than 180 nm;
a depth of the heterojunction layer is greater than 30 nm and less than 50 nm; and
a depth of the emitter-contact layer is greater than 20 nm and less than 40 nm.

8. The BAC solar cell of claim 1 where:
the depth of the window layer is greater than 19 nm and less than 21 nm;
the depth of the absorption layer is greater than 1800 nm and less than 2200 nm;
the depth of the BSF layer is greater than 19 nm and less than 21 nm;
the depth of the BSF-contact layer is greater than 19 nm and less than 22 nm;
the depth of the emitter layer is greater than 145 nm and less than 155 nm;
the depth of the heterojunction layer is greater than 38 nm and less than 42 nm; and
the depth of the emitter-contact layer is greater than 19 nm and less than 21 nm.

9. The BAC solar cell of claim 7 where the first conductivity type is n-type and the second conductivity type is p-type, and where the window layer comprises Al$_x$Ga$_{(1-x)}$As, the heterojunction layer comprises Al$_y$Ga$_{(1-y)}$As, and the BSF layer comprises Al$_z$Ga$_{(1-z)}$As, and where $0.25<x<0.35$, $0.75<y<0.95$, and $0.25<z<0.35$.

10. The BAC solar cell of claim 7 where the first conductivity type is p-type and the second conductivity type is n-type, and where the window layer comprises Al$_x$Ga$_{(1-x)}$As, the heterojunction layer comprises Al$_y$Ga$_{(1-y)}$As, and the BSF layer comprises Al$_z$Ga$_{(1-z)}$As, and where $0.65<x<0.75$, $0.1<y<0.2$, and $0.65<z<0.75$.

11. The BAC solar cell of claim 7 where the emitter layer is in contact with the absorption layer over a width $w_1$ and the BSF layer is in contact with the absorption layer over a width $w_2$, and $1.4<w_1/w_2<1.6$.

12. The BAC solar cell of claim 11 where the emitter layer is displaced from the BSF layer by an insulator gap having a width $w_G$, and where a width $w_{Total}$ is equal to $w_1+w_2+w_G$, and where $(w_1+w_2)/w_{Total}>0.9$.

13. A Back-surface, Alternating Contacts (BAC) solar cell comprising:
a window layer comprising AlGaAs doped to a first conductivity type, where a doping concentration of the AlGaAs comprising the window layer is greater than $3\times(10^{18})$ cm$^{-3}$ and less than $5\times(10^{18})$ cm$^{-3}$, and where a depth of the window layer is greater than 20 nm and less than 40 nm;

an absorption layer contacting the window layer where the absorption layer comprises GaAs doped to the first conductivity type, where a doping concentration of the GaAs comprising the absorption layer is greater than $3\times(10^{17})$ cm$^{-3}$ and less than $5\times(10^{17})$ cm$^{-3}$, and where a depth of the absorption layer is greater than 1000 nm and less than 3000 nm;

a BSF layer contacting the absorption layer and separated from the window layer by the absorption layer, where the BSF layer comprises AlGaAs doped to the first conductivity type, where a doping concentration of the BSF layer is greater than $3\times(10^{18})$ cm$^{-3}$ and less than $5\times(10^{18})$ cm$^{-3}$;

a BSF-contact layer contacting the BSF layer and separated from the absorption layer by the BSF layer, where the BSF-contact layer comprises GaAs doped to the first conductivity type, where a doping concentration of the GaAs comprising the BSF-contact layer is greater than $8\times(10^{18})$ cm$^{-3}$ and less than $1.2\times(10^{19})$ cm$^{-3}$, and where a depth of the BSF layer is greater than 20 nm and less than 40 nm;

a first contact coupled to the BSF-contact layer and separated from the BSF layer by the BSF-contact layer;

an emitter layer contacting the absorption layer and separated from the window layer by the absorption layer, and the emitter layer displaced from the BSF layer, the BSF-contact layer, and the first contact, where the emitter layer comprises GaAs doped to a second conductivity type, where a doping concentration of the GaAs comprising the emitter layer is greater than $8\times(10^{17})$ cm$^{-3}$ and less than $1.2\times(10^{18})$ cm$^{-3}$, and where a depth of the emitter layer is greater than 120 nm and less than 180 nm;

a heterojunction layer contacting the emitter layer and separated from the absorption layer by the emitter layer, and the heterojunction layer displaced from the BSF layer, the BSF-contact layer, and the first contact, where the heterojunction layer comprises AlGaAs doped to the second conductivity type, where a doping concentration of the AlGaAs comprising the heterojunction layer is greater than $2\times(10^{18})$ cm$^{-3}$ and less than $4\times(10^{18})$ cm$^{-3}$, and where a depth of the heterojunction layer is greater than 30 nm and less than 50 nm;

a emitter-contact layer contacting the heterojunction layer and separated from the emitter layer by the heterojunction layer, and the emitter-contact layer displaced from the BSF layer, the BSF-contact layer, and the first contact, where the emitter-contact layer comprises GaAs doped to the second conductivity type, where a doping concentration of the GaAs comprising the emitter-contact layer is greater than $8\times(10^{18})$ cm$^{-3}$ and less than $1.2\times(10^{19})$ cm$^{-3}$, and where a depth of the emitter-contact layer is greater than 20 nm and less than 40 nm; and a second contact coupled to the emitter-contact layer and separated from the heterojunction layer by the emitter-contact layer.

14. The BAC solar cell of claim 13 where the emitter layer is in contact with the absorption layer over a width $w_1$, the BSF layer is in contact with the absorption layer over a width $w_2$, and the emitter layer is displaced from the BSF layer by an insulator gap having a width $w_G$, and where $1.4 < w_1/w_2 < 1.6$ and $(w_1+w_2)/(w_1+w_2+w_G) > 0.9$.

15. The BAC solar cell of claim 14 where the first conductivity type is n-type and the second conductivity type is p-type, and where the window layer comprises $Al_xGa_{(1-x)}As$, the heterojunction layer comprises $Al_yGa_{(1-y)}As$, and the BSF layer comprises $Al_zGa_{(1-z)}As$, and where $0.25 < x < 0.35$, $0.75 < y < 0.95$, and $0.25 < z < 0.35$.

16. The BAC solar cell of claim 14 where the first conductivity type is p-type and the second conductivity type is n-type, and where the window layer comprises $Al_xGa_{(1-x)}As$, the heterojunction layer comprises $Al_yGa_{(1-y)}As$, and the BSF layer comprises $Al_zGa_{(1-z)}As$, and where $0.65 < x < 0.75$, $0.1 < y < 0.2$, and $0.65 < z < 0.75$.

* * * * *